(12) United States Patent
Chen et al.

(10) Patent No.: US 10,674,627 B2
(45) Date of Patent: Jun. 2, 2020

(54) MODIFIABLE RACK POST

(71) Applicant: QUANTA COMPUTER INC., Taoyuan (TW)

(72) Inventors: Chao-Jung Chen, Taoyuan (TW); Ta-Chih Chen, Taoyuan (TW); Chih-Ming Chen, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 0 days.

(21) Appl. No.: 15/891,766

(22) Filed: Feb. 8, 2018

(65) Prior Publication Data
US 2019/0246513 A1 Aug. 8, 2019

(51) Int. Cl.
| H05K 7/14 | (2006.01) |
| H05K 7/18 | (2006.01) |
| A47B 96/07 | (2006.01) |
| A47B 57/00 | (2006.01) |
| A47B 81/00 | (2006.01) |

(52) U.S. Cl.
CPC .......... H05K 7/1489 (2013.01); A47B 57/00 (2013.01); A47B 81/00 (2013.01); A47B 96/07 (2013.01); H05K 7/183 (2013.01)

(58) Field of Classification Search
CPC .... H05K 7/1489; H05K 7/1491; H05K 7/183; A47B 57/00; A47B 81/00; A47B 96/07
See application file for complete search history.

(56) References Cited

U.S. PATENT DOCUMENTS

| 6,863,188 | B2* | 3/2005 | Besserer | A47B 88/43 |
| | | | | 211/175 |
| 7,934,607 | B2* | 5/2011 | Henderson | H05K 7/1489 |
| | | | | 211/175 |
| 8,040,693 | B2* | 10/2011 | Blomquist | H04Q 1/02 |
| | | | | 174/481 |
| 8,787,023 | B2* | 7/2014 | Lewis, II | H05K 7/18 |
| | | | | 361/724 |
| 8,901,438 | B2* | 12/2014 | Lewis, II | H05K 5/0234 |
| | | | | 174/50 |
| 9,351,427 | B2* | 5/2016 | Lewis, II | H05K 5/0004 |
| 9,408,326 | B2* | 8/2016 | Lewis, II | H05K 5/0234 |
| 9,420,727 | B2* | 8/2016 | Lewis, II | H05K 5/0004 |
| 9,642,270 | B2* | 5/2017 | Lewis, II | H05K 5/0217 |
| 9,814,156 | B2 | 11/2017 | Wilson et al. | |
| 9,814,159 | B2* | 11/2017 | Lewis, II | H05K 7/183 |

(Continued)

FOREIGN PATENT DOCUMENTS

| CN | 101039447 A | 9/2007 |
| CN | 106688317 A | 5/2017 |

OTHER PUBLICATIONS

TW Office Action for Application No. 107111678, dated Jan. 17, 2019, w/ First Office Action Summary.

(Continued)

*Primary Examiner* — Patrick D Hawn
(74) *Attorney, Agent, or Firm* — Nixon Peabody LLP; Zhou Lu (57) ABSTRACT

A rack is provided that includes a top frame and a bottom frame connected by at least one post. The post is slidably configured within the rack. The rack also includes a plurality of brackets installed on the post. Each of the brackets within the plurality of brackets is configured to rotate with respect to the at least one post.

20 Claims, 6 Drawing Sheets

(56) References Cited

U.S. PATENT DOCUMENTS

| | | | |
|---|---|---|---|
| 9,949,406 B2* | 4/2018 | Lewis, II | H05K 7/183 |
| 2004/0183409 A1 | 9/2004 | Rinderer | |
| 2009/0224110 A1* | 9/2009 | Donowho | H02G 3/0456 |
| | | | 248/65 |
| 2012/0062091 A1* | 3/2012 | Donowho | H04Q 1/062 |
| | | | 312/351.1 |
| 2012/0273438 A1* | 11/2012 | Nordin | H04Q 1/025 |
| | | | 211/26 |
| 2013/0148294 A1* | 6/2013 | Liang | H05K 7/1491 |
| | | | 361/679.58 |
| 2013/0214658 A1* | 8/2013 | Liang | H05K 7/1491 |
| | | | 312/223.2 |
| 2015/0002006 A1* | 1/2015 | Segroves | H05K 7/1491 |
| | | | 312/236 |
| 2015/0366094 A1* | 12/2015 | Segroves | H05K 7/1491 |
| | | | 312/236 |
| 2017/0042057 A1* | 2/2017 | Segroves | H05K 7/1491 |
| 2017/0064859 A1* | 3/2017 | Chen | H05K 7/1488 |
| 2017/0181312 A1* | 6/2017 | Chen | H05K 7/183 |
| 2017/0215587 A1* | 8/2017 | Jost | A47B 57/54 |
| 2017/0223865 A1* | 8/2017 | Lewis, II | A47B 57/54 |

OTHER PUBLICATIONS

TW Search Report for Application No. 107111678, dated Jan. 17, 2019, w/ First Office Action.
Extended European Search Report for EP Application No. 18174129.9, dated Jan. 4, 2019.

* cited by examiner

MODIFIABLE RACK POST

FIELD OF THE INVENTION

The present disclosure relates to a bracket assembly, and more particularly, to a modifiable bracket assembly for a server rack.

BACKGROUND

Computer enclosures and other types of electronic equipment are sometimes mounted in a vertical rack structure. This technique is referred to as "rack mounting" and is frequently used, for example, with server-type computers. Most rack structures include four vertical corner posts. Pairs of horizontal slide rail assemblies are attached to the corner posts to create slots or drawers into which the computer enclosures are received or inserted. These horizontal slide rails are known in the art as brackets.

Rectangular-shaped metal chassis are used for the storage and ready accessibility of magnetic disk drive storage media. Typically, the chassis' body is mounted with screws to the brackets within the storage rack. As installed, the chassis is accessible at its front and back for viewing, replacement, repair, and monitoring of its contents. The chassis can vary in depth, as there are various standards for the depth of such chassis or the storage racks.

A smaller chassis (with respect to depth) may be preferred based on the size of the equipment stored in the chassis. A smaller chassis may also be preferred because it is more portable than larger counterparts with greater depth. However, a small size chassis is not deep enough to be mounted to a larger-sized storage rack, thereby limiting its installation to only small size storage racks. The need to purchase racks of different sizes results in extra expense accompanied by a need for additional storage space to fit the varying sizes of the storage racks and chassis. Moreover, the common state of the art prevents chassis of varying sizes from being mounted together in one conveniently located storage rack.

SUMMARY

The various embodiments concern a rack for storing various sized chassis. The rack includes a top frame and a bottom frame connected by at least one post. The post is slidably configured within the rack. The rack also includes a plurality of brackets installed on the post. Each of the brackets within the plurality of brackets is configured to rotate with respect to the at least one post.

In some embodiments, the top frame includes a first set of front-to-back beams and top side-to-side beams. Furthermore, the bottom frame includes a second set of front-to-back beams and bottom side-to-side beams. The rack can also include vertical posts connected to the top frame and the bottom frame. The rack can also include rail assemblies connected to the vertical posts. In an exemplary embodiment, the post includes openings for mounting configured to mount at least one piece of electronic equipment. In some embodiments, the post includes mounting openings configured to mount the plurality of brackets. In some embodiments, each bracket within the plurality of brackets includes an L-shaped first portion and a planar second portion. The L-shaped first portion includes a plurality of mounting openings. In some embodiments, the planar second portion includes a threaded member and an alignment hole.

Additional features and advantages of the various embodiments will be set forth in the description that follows, and in part, will be obvious from the description; or can be learned by practice of the herein disclosed principles. The features and advantages of the various embodiments can be realized and obtained by means of the instruments and combinations particularly pointed out in the appended claims.

BRIEF DESCRIPTION OF THE DRAWINGS

In order to describe the manner in which the above-recited disclosure and its advantages and features can be obtained, a more particular description of the principles briefly described above will be rendered by reference to specific examples illustrated in the appended drawings. These drawings depict only exemplary embodiments, and are therefore not to be considered to be limiting of the scope of the various embodiments or the claims. The principles are described and explained with additional specificity and detail through the use of the following drawings.

DETAILED DESCRIPTION

The various embodiments are described with reference to the attached figures, wherein like reference numerals are used throughout the figures to designate similar or equivalent elements. The figures are not drawn to scale, and they are provided merely to illustrate the various embodiments. Several embodiments are described below with reference to example applications for illustration. It should be understood that numerous specific details, relationships, and methods are set forth to provide a full understanding of the various embodiments. One having ordinary skill in the relevant art, however, will readily recognize that the various embodiments can be practiced without one or more of the specific details or with other methods. In other instances, well-known structures or operations are not shown in detail to avoid obscuring certain aspects of the various embodiments. The various embodiments are not limited by the illustrated ordering of acts or events, as some acts may occur in different orders and/or concurrently with other acts or events. Furthermore, not all illustrated acts or events are required to implement a methodology in accordance with the various embodiments.

In general, the various embodiments are directed to a modifiable post bracket for chassis of varying sizes within a rack server. In one or more implementations, the movable post enables an operator to effectively utilize the space within the rack. Moreover, the modifiable post brackets can vary in orientation. The modifiable post brackets allow chassis of different depths to be installed for a particular position of the movable post. Furthermore, the modifiable post brackets enable an operator to install the chassis in either the front or the rear of the rack. The size of a piece of rack-mounted equipment is typically described as a rack unit, identified as "U". A rack unit is a unit of measure defined as 44.50 millimeters (1.752 in). It is most frequently used as a measurement of the overall height of 19-inch and 23-inch rack frames, as well as the height of equipment that mounts in these frames. The height of the frame or equipment is expressed as multiples of rack units. For example, a typical full-size rack cage is 42 U high, while equipment is typically 1 U, 2 U, 3 U, or 4 U high. For example, equipment that is one rack unit tall is often referred to as "1 U"; equipment that is two rack units tall as "2 U"; and so on. The disclosed post brackets also provide varying U numbers. This enables chassis and other electronic components installed directly within the rack to have additional space.

Figure 1A:
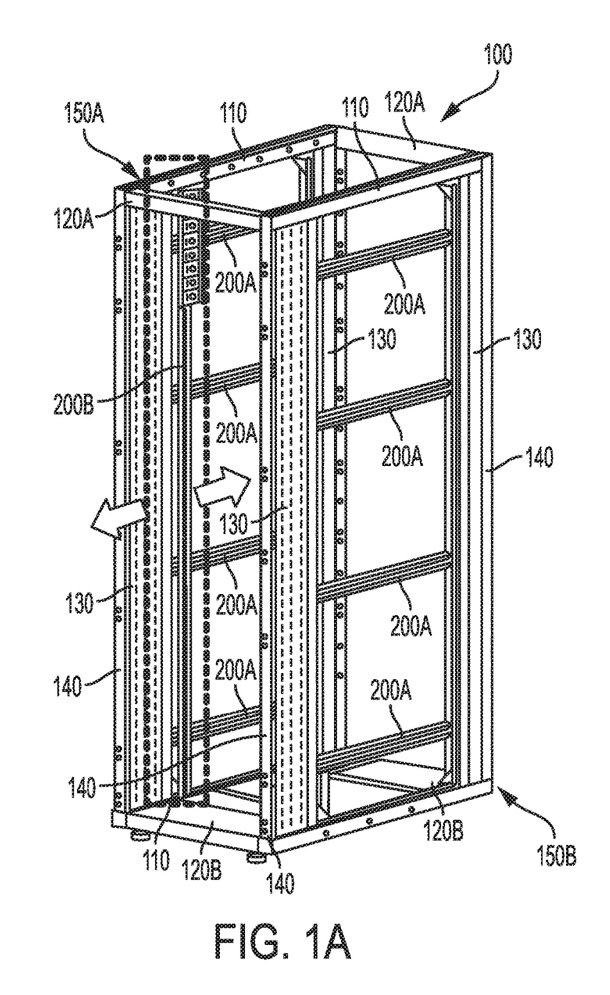
FIG. 1A illustrates a perspective view of a rack, showing the post installed in a first position, according to one or more embodiments.

FIG. 1A illustrates a perspective view of a rack 100 of an exemplary embodiment. The rack 100 may be one of a plurality of racks installed in a data center. The rack 100 includes front-to-back beams 110, top side-to-side beams 120A, bottom side-to-side beams 120B, vertical posts 130, rail assemblies 200A, post 200B, and face plates 140. The front-to-back beams 110 and the top side-to-side beams 120A are connected to form a top frame 150A. Similarly, the front-to-back beams 110 and the bottom side-to-side beams 120B are connected to form a bottom frame 150B. In some embodiments, the front-to-back beams 110 are permanently connected to the side-to-side beams 120A, 120B. For example, the front-to-back beams 110 are connected to the side-to-side beams 120A, 120B using permanent connectors such as rivets and welds. In alternative embodiments, the front-to-back beams 110 are removably connected to the side-to-side beams 120A, 120B. For example, the front-to-back beams 110 are connected to the side-to-side beams 120A, 120B using removable connectors or fasteners, such as nuts and bolts, screws, or the like.

The vertical posts 130 are connected to the top and bottom frames 150A, 150B to form the rack 100. Specifically, the vertical posts 130 are connected to the side-to-side beams 120A, 120B. In some embodiments, the vertical posts 130 are removably connected to the side-to-side beams 120A, 120B. For example, the vertical posts 130 are connected to the side-to-side beams 120A, 120B using removable connectors, such as nuts and bolts and screws. In alternative embodiments, the vertical posts 130 are permanently connected to the side-to-side beams 120A, 120B. For example, the vertical posts 130 are permanently connected to the side-to-side beams 120A, 120B using permanent connectors, such as rivets and welds.

In some embodiments, the face plates 140 are removably connected to the side-to-side beams 120A, 120B and vertical posts 130. For example, the face plates 140 are connected to the side-to-side beams 120A, 120B and vertical posts 130 using removable connectors, such as nuts and bolts and screws. In alternative embodiments, the face plates 140 are permanently connected to side-to-side beams 120A, 120B. For example, the face plates 140 are connected to side-to-side beams 120A, 120B using permanent connectors, such as rivets and welds. The face plates 140 provide additional stiffness to the rack 100, and more particularly, to the side-to-side beams 120A, 120B and vertical posts 130.

The rail assemblies 200A are connected to the vertical posts 130 of the rack 100. In some embodiments, the rail assemblies 200A are removably connected to the vertical posts 130. For example, the rail assemblies 200A are connected to the vertical posts 130 using removable connectors, such as nuts and bolts and screws. In alternative embodiments, the rail assemblies 200A are permanently connected to the vertical posts 130. For example, the rail assemblies 200A are connected to the vertical posts 130 using permanent connectors, such as rivets and welds.

Figure 1B:
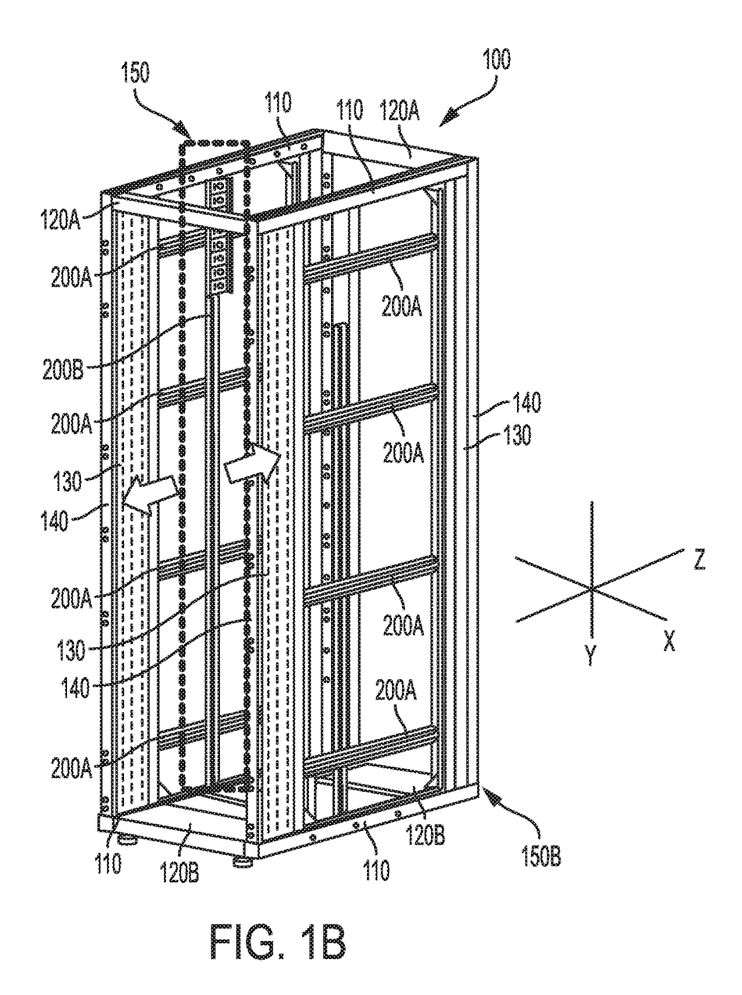
FIG. 1B illustrates a perspective view of a rack, showing the post installed in a second position, according to one or more embodiments.

As shown in FIGS. 1A and 1B, the post 200B is connected to the rack 100, and more particularly, to the rail assemblies 200A. Preferably, the post 200B is connected to the rack 100 at the rail assemblies 200A near the top and bottom frames 150A and 150B. In an alternative embodiment, the post 200B is connected to the rack 100, and more particularly, to the front-to-back beams 110 of top and bottom frames 150A, 150B. Although one post 200B is exemplified in the figures for simplicity purposes, more than one post can be implemented in various embodiments. For example, another post can be implemented opposite of post 200B such that a chassis (not shown) can be supported within the rack 100. The post 200B is adjustable. That is, the post 200B is removably connected using removable connectors, such as nuts and bolts and screws.

Figure 2:
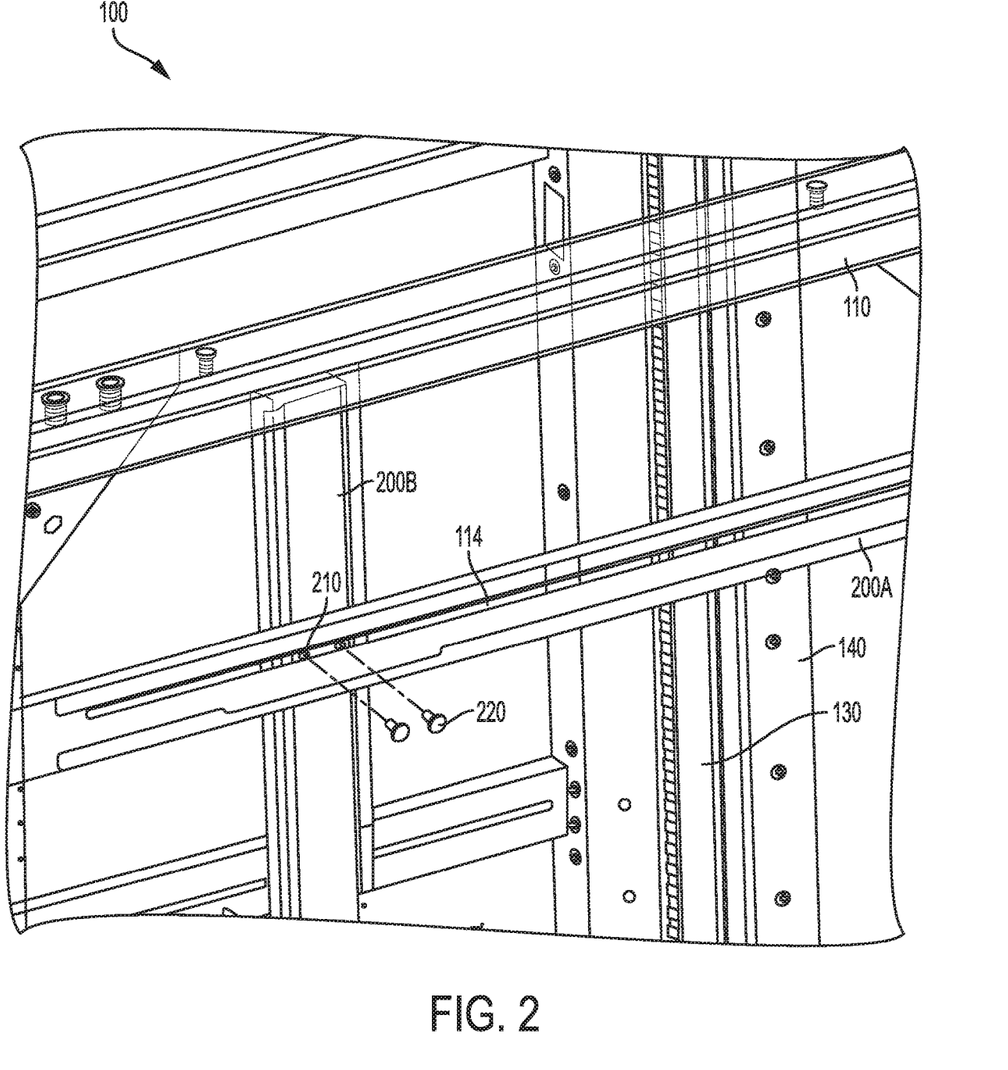
FIG. 2 illustrates a perspective view of a post installed within the rack of FIGS. 1A and 1B, according to one or more embodiments.

For example, as shown in FIG. 2, the post 200B can include threaded holes 210 configured to receive mounting bolts 220. The threaded holes 210 can also be implemented to align the mounting bolts with side openings 114 of the rail assembly 200A. In securing the post 200B to the rail assemblies 200A, the mounting bolt 220 effectively secures the post 200B to the rack 100. In some embodiments, the threaded holes 210 and the mounting bolts 220 are engaged and tight. Thus, the post 200B is secured to the rail assemblies 200A. In other embodiments, the threaded holes 210 and the mounting bolts 220 are engaged, but loose. Thus, the post 200B is able to slide along the elongated openings 114 of the rail assemblies 200A. This enables the post 200B to be positioned at any number of locations along the elongated opening 114 of the rail assemblies 200A.

Referring back to FIG. 1B, the post 200B is shown in a second position along the axis. Depending on the location of the post 200B, additional cable routing areas might be provided, for example, in the front of the rack 100 and in the back of the rack 100.

Figure 3:
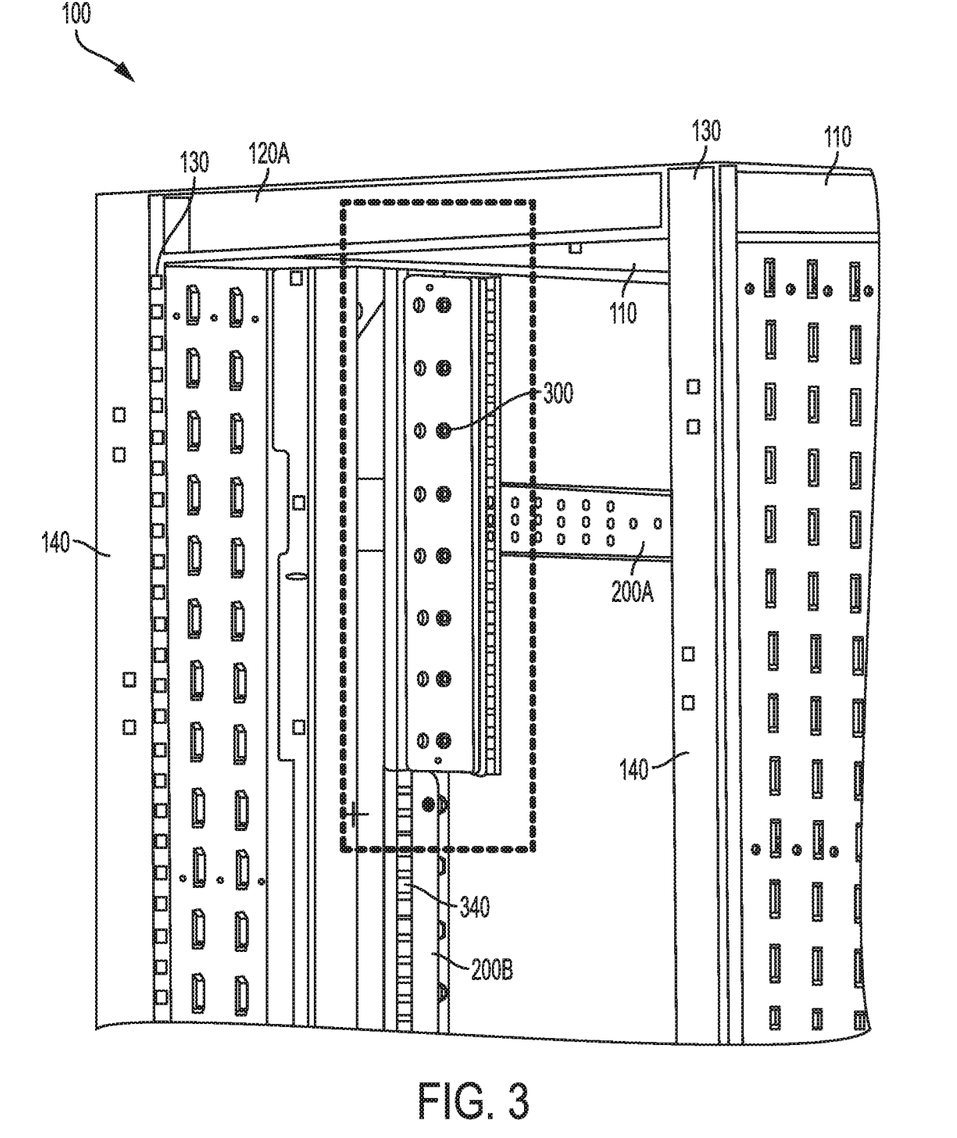
FIG. 3 illustrates a perspective view of a bracket installed onto the post of FIG. 2, according to one or more embodiments.

FIG. 3 illustrates a perspective view of a bracket assembly 300 installed onto the post 200B of the rack 100. The post 200B can include mounting openings 340 and a bracket assembly 300. The mounting openings 340 can be implemented for installing the bracket assembly 300. The bracket assembly 300 can be configured to mount electronic equipment, such as servers, patch panels, and switches, in the rack 100. Furthermore, the bracket assembly 300 can be configured to mount accessories, such as patch panel cassettes and cable management fingers in the cable routing area (not shown) of the rack 100. The bracket assembly 300 can be made of sheet metal or any other material capable of withstanding the weight of the chassis (not shown) when the chassis is inserted inside the rack 100. The bracket assembly 300 is discussed in greater detail below with respect to FIG. 4.

Figure 4:
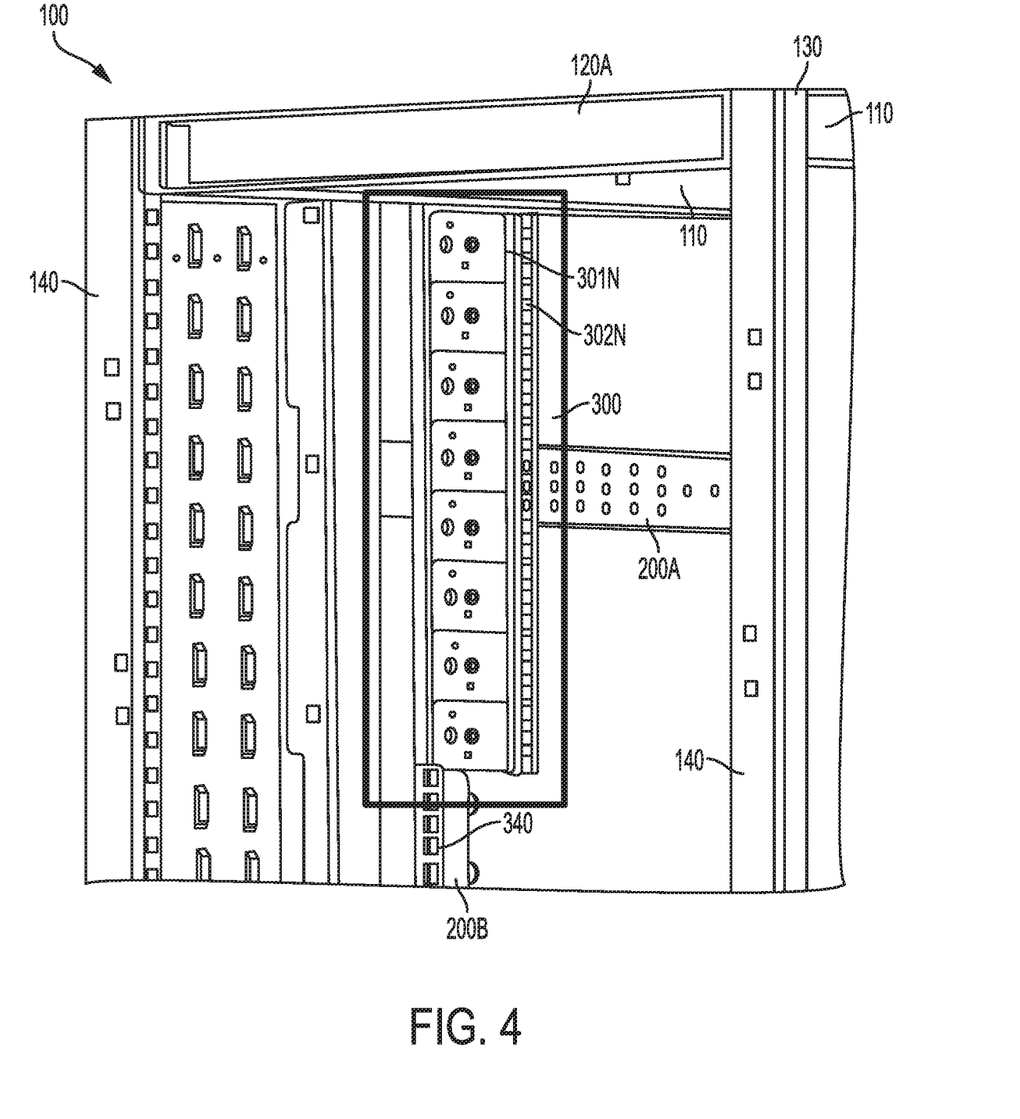
FIG. 4 illustrates a perspective view of a plurality of individual brackets installed onto the bracket assembly of FIG. 3, according to one or more embodiments.

FIG. 4 illustrates a perspective view of the plurality of individual brackets 301N installed onto the bracket assembly 300 of the post 200B. The bracket assembly 300 can include a plurality of individual brackets 301N. As illustrated, a bracket 301N can be L-shaped when held horizontally and viewed from the top. The bracket 301N can include a plurality of mounting openings 302N for mounting electronic equipment, such as servers, patch panels, and switches, in the rack 100. Each bracket 301N can be removably connected to the post 200B, using removable connectors, such as nuts and bolts and screws. In some rare embodiments, each bracket 301N can be permanently connected to the post 200B, using permanent connectors, such as rivets and welds. Alternatively, each bracket 301N and the post 200B can be integrally formed. For example, the bracket 301N can be configured to snap-fit into the post 200B. As such, each bracket 301N can be configured to be quickly and easily removed from the post 200B, providing greater access to the bracket 301N.

Figure 5:
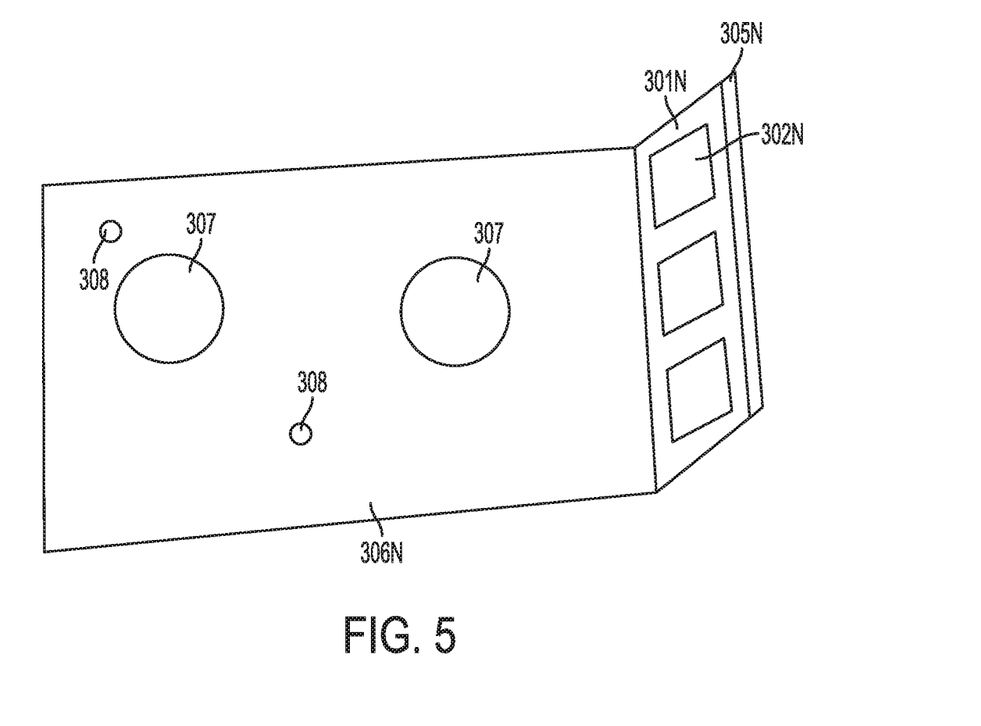
FIG. 5 illustrates a perspective view of an individual bracket of FIG. 4, according to one or more embodiments.

FIG. 5 illustrates a perspective view of an individual bracket 301N. The bracket 301N can be 1 U. Thus, the bracket 301N can be one rack unit tall. In some embodiments, the bracket 301N can vary in height size to correspond with electronic equipment that may have a height of multiple rack units. Each bracket 301N has a generally L-shaped first portion 305N and a generally planar second portion 306N. First portion 305N of bracket 301N can include mounting openings 302N for mounting electronic equipment, such as servers, patch panels, and switches, in the rack 100. The mounting openings 302N can be configured to receive, for example, horizontal blanking panels and vertical blanking panels for sealing open areas of the rack (of FIG. 4) to separate cooled intake air and heated exhaust air. The generally planar second portion 306N can include threaded members 308 and alignment holes 307. The bracket 301N can be secured to the post 200B (of FIG. 4) via the threaded members 308 with screws or nuts and bolts (not shown). For example, the bolts (not shown) can be inserted through the alignment holes 307 in the second portions 306N and secured by nuts (not shown). Thus, the bracket 301N can be rigidly secured to the post 200B. In some embodiments, the bracket 301N can include an individual aligned hole 307, about which the bracket 301N is configured to rotate. The rotating bracket 301N is discussed in greater detail below with respect to FIG. 6.

Figure 6:
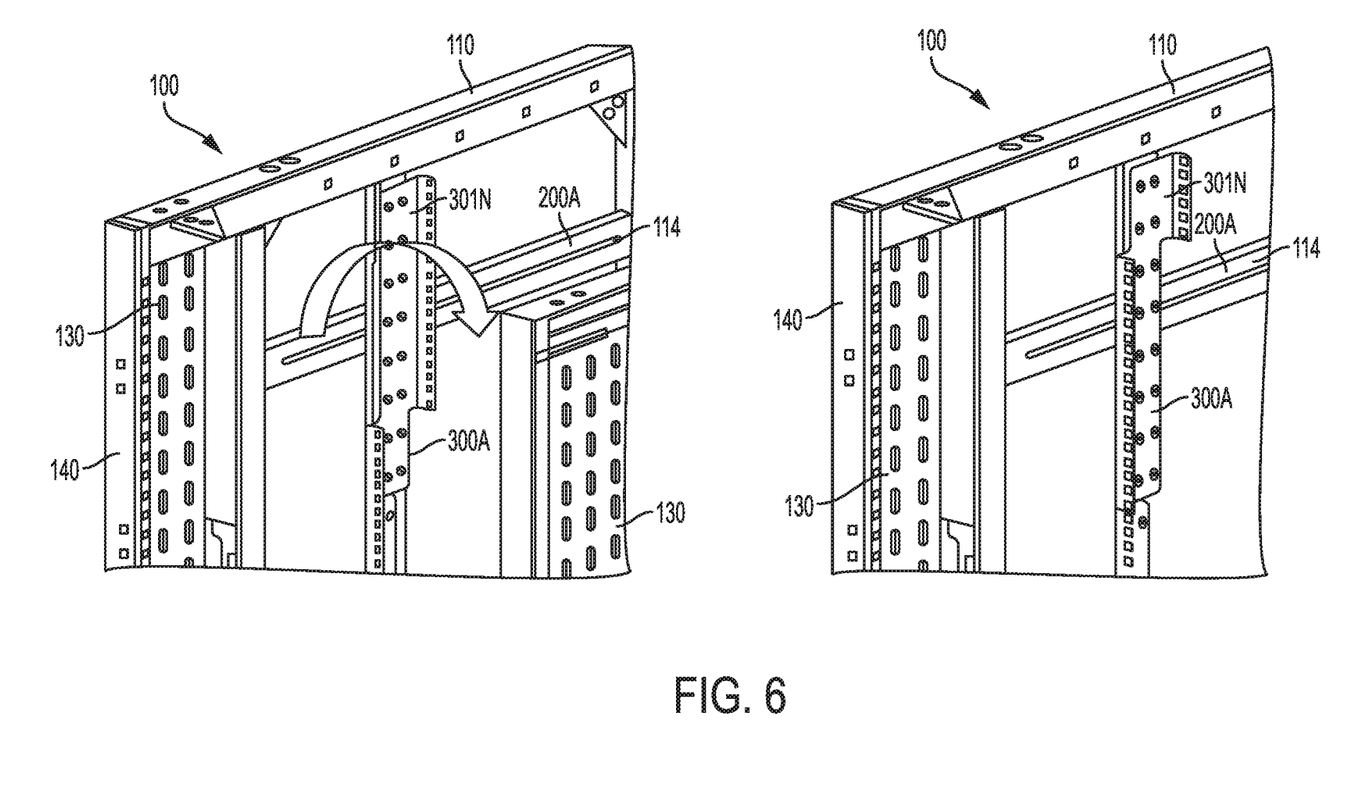
FIG. 6 illustrates a perspective view of the brackets of FIG. 5 configured to rotate within the rack, according to one or more embodiments.

FIG. 6 illustrates a perspective view of the plurality of individual brackets 301N configured to rotate within the rack 100. Each individual bracket 301N can be oriented in a different direction based on the preference and needs of the operator. For example, the chassis can have various sizes. The disclosed bracket 301N enables a configuration where multiple chassis (not shown) of various sizes are installed into a single rack 100. Despite the various sizes of the chassis (not shown), an operator may want the chassis installed into the rack to be accessible at a consistent location. For example, the rack 100 can be designed as a flush mount configuration, where the chassis (not shown) installed in the rack 100 are flush at an opening of the rack 100 despite their varying sizes. Furthermore, the rack 100 can be designed as a center mount configuration, where the chassis installed in the rack 100 are centered within the rack 100 despite their varying sizes. When orienting the rack 100 to either a flush mount configuration or to a center mount configuration, the individual brackets 301N can be rotated 180 degrees, as needed. Furthermore, the post 200B can be positioned along the front-to-back beams 110 as needed. Where a chassis (not shown) is mounted in a flush mount configuration the corresponding bracket 301N can be oriented such that the first portion 305N (shown in FIG. 5) is located towards the center of the rack 100. Moreover, where a chassis (not shown) is mounted in a center mount configuration the corresponding bracket 301N can be oriented such that the first portion 305N (shown in FIG. 5) is located towards the front of the rack 100.

The plurality of rotatable brackets 301N can provide structural stability to support a computer system of other equipment in a two post rack. In some embodiments the brackets 301N can be oriented to mirror one another in a two post rack. Thus, a chassis can be mounted to the posts of the rack 100 such that brackets 301N are mounted on opposite faces of the posts of the rack, providing the necessary structural stability to the chassis (not shown) and the posts of the equipment rack. In addition, because the various embodiments can accommodate a sliding mechanism for the post 300A, the disclosed rack 100 provides for the serviceability of a computer system mounted in the rack 100.

The disclosed rack 100 is also able to accommodate computer systems and other housing of electronic units of varying heights. Traditional computer systems, especially server systems, are finding more application in telecommunications and internet service provider environments.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The terminology used herein is for the purpose of describing particular embodiments only and is not intended to limit the invention. As used herein, the singular forms "a", "an", and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A rack comprising:
   a top frame;
   a bottom frame;
   a slidable post coupled to the top frame and the bottom frame, the slidable post configured to slide within the rack, the slidable post having a width defined along a direction of sliding; and
   a plurality of brackets installed on the slidable post, each of the plurality of brackets having a width greater than the width of the slidable post, the each of the plurality of brackets being configured to rotate with respect to the slidable post from a first orientation to a second orientation, the plurality of brackets comprising a first portion of brackets and a second portion of brackets,
   wherein each of the first portion of brackets is positioned adjacent to one another and configured to rotate to the first orientation to secure a first chassis, and wherein each of the second portion of brackets is positioned adjacent to one another and configured to rotate to the second orientation to secure a second chassis deeper than the first chassis.

2. The rack of claim 1, wherein the top frame comprises a first set of front-to-back beams and a first set of side-to-side beams.

3. The rack of claim 2, wherein the bottom frame comprises a second set of front-to-back beams and a second set of side-to-side beams.

4. The rack of claim 1, further comprising a plurality of vertical posts connected to the top frame and the bottom frame.

5. The rack of claim 4, further comprising a rail assembly connected to at least two of the plurality of vertical posts, wherein the slidable post is enabled to position at any location along an elongated opening of the rail assembly.

6. The rack of claim 1, wherein the slidable post comprises mounting openings configured to mount at least one piece of electronic equipment.

7. The rack of claim 1, wherein the slidable post comprises mounting openings configured to mount the plurality of brackets.

8. The rack of claim 1, wherein each of the plurality of brackets comprises an L-shaped first portion and a planar second portion.

9. The rack of claim 8, wherein the L-shaped first portion comprises a plurality of mounting openings configured to mount at least one piece of electronic equipment.

10. The rack of claim 8, wherein the planar second portion comprises a threaded member and an alignment hole.

11. The rack of claim 1, wherein the slidable post is configured to slide along a rail assembly while partially affixed to the rail assembly.

12. The rack of claim 1, wherein a first one of the plurality of brackets is configured to only accommodate the first chassis up to a first depth and a second one of the plurality of brackets is configured to only accommodate the second chassis up to a second depth.

13. A rack comprising:
a top frame and a bottom frame connected by a plurality of vertical frame posts;
a rail assembly coupled to two of the plurality of vertical frame posts;
a slidable post slidably configured within the rack, such that the slidable post is enabled to position at any location along an elongated opening of the rail assembly, the slidable post having a width defined along a direction of sliding; and
a plurality of brackets installed on the slidable post, a first bracket of the plurality of brackets being installable to a different height of the slidable post from a second bracket of the plurality of brackets, the height of the slidable post being perpendicular to the direction of sliding, each of the plurality of brackets having a width greater than the width of the slidable post, each of the plurality of brackets being configured to rotate with respect to the slidable post from a first orientation to a second orientation, the plurality of brackets comprising a first portion of brackets and a second portion of brackets, wherein each of the first portion of brackets is positioned adjacent to one another and configured to rotate to the first orientation to secure a first chassis, and wherein each of the second portion of brackets is positioned adjacent to one another and configured to rotate to the second orientation to secure a second chassis deeper than the first chassis.

14. The rack of claim 13, wherein the first bracket of the plurality of brackets is configured to accommodate the first chassis with a first maximum depth while the second bracket of the plurality of brackets is configured to accommodate the second chassis with a second maximum depth.

15. The rack of claim 13, wherein each of the plurality of brackets is configured to rotate from the first orientation to the second orientation while partially affixed to the slidable post.

16. The rack of claim 13, wherein the first bracket of the plurality of brackets is directly adjacent to the second bracket of the plurality of brackets.

17. A rack comprising:
a top frame having a front-to-back beam and a top side-to-side beam;
a bottom frame having a bottom side-to-side beam;
a vertical frame post coupled to the top side-to-side beam and the bottom side-to-side beam;
a rail assembly coupled to the vertical frame post and extending parallel to the front-to-back beam;
a first slidable post coupled to the rail assembly and configured to slide along the rail assembly, the first slidable post having a width defined parallel to the front-to-back beam and a height defined parallel to the vertical frame post; and
a first plurality of brackets installable on the first slidable post, each of the plurality of brackets having a width greater than the width of the slidable post, the each of the plurality of brackets being installable to a different height of the first slidable post, the first plurality of brackets comprising a first portion of brackets and a second portion of brackets, wherein each of the first portion of brackets is positioned adjacent to one another and configured to rotate to a first orientation to secure a first chassis, and wherein each of the second portion of brackets is positioned adjacent to one another and configured to rotate to a second orientation to secure a second chassis deeper than the first chassis.

18. The rack of claim 17, wherein the first slidable post is directly coupled to the rail assembly via removable connectors.

19. The rack of claim 17, further comprising a second plurality of brackets installable on a second slidable post, wherein:
each of the second plurality of brackets is configured to rotate to different orientations to accommodate chassis with different depths, and
at least one of the first plurality of brackets and at least one of the second plurality of brackets are configured to rotate to a same orientation to receive a same chassis.

20. The rack of claim 19, wherein the at least one of the first plurality of brackets is installable to opposite the at least one of the second plurality of brackets.

* * * * *